United States Patent [19]
Cowen et al.

[11] Patent Number: 5,742,205
[45] Date of Patent: Apr. 21, 1998

[54] FIELD EFFECT TRANSISTOR CABLE TELEVISION LINE AMPLIFIER

[75] Inventors: Martin A. Cowen, Lawrenceville, Ga.; Scott R. Siclari, Collegeville, Pa.; Leo J. Thompson, Lilburn, Ga.; Steven Veneman, Joppa, Md.

[73] Assignee: Scientific-Atlanta, Inc., Norcross, Ga.

[21] Appl. No.: 686,022

[22] Filed: Jul. 25, 1996

Related U.S. Application Data

[60] Provisional application No. 60/001,557, Jul. 27, 1995.
[51] Int. Cl.⁶ .................................................... H03F 3/26
[52] U.S. Cl. .......................... 330/269; 330/271; 330/276; 330/311
[58] Field of Search ............................ 330/269, 271, 330/275, 276, 311

[56] References Cited

U.S. PATENT DOCUMENTS

| | | | |
|---|---|---|---|
| 4,112,386 | 9/1978 | Everhart et al. | 330/276 X |
| 4,409,557 | 10/1983 | Sechi | 330/311 X |
| 5,010,304 | 4/1991 | Mueller | 330/269 |
| 5,047,228 | 9/1991 | Bayruns . | |

FOREIGN PATENT DOCUMENTS

| | | | |
|---|---|---|---|
| 269305 | 10/1989 | Japan | 330/276 |

Primary Examiner—James B. Mullins
Attorney, Agent, or Firm—Kenneth M. Massaroni; John Victor Pezdek

[57] ABSTRACT

An amplifier circuit for a cable access television line amplifier has a circuit input and a circuit output and includes a first cascode amplifier having a first input and a first output, and a second cascode amplifier having a second input and a second output where the second cascode amplifier is coupled in a push-pull arrangement with the first cascode amplifier. The amplifier circuit further includes input circuitry for coupling the circuit input to the first and second inputs and output circuitry for coupling the first and second outputs to the circuit output. The first cascode amplifier includes a first field effect transistor coupled to the first input; the second cascode amplifier includes a second field effect transistor coupled to the second input; the first cascode amplifier further includes a third field effect transistor coupled to the first output; and the second cascode amplifier further includes a fourth field effect transistor coupled to the second output. An alternative amplifier circuit for a cable access television line amplifier has a circuit input and a circuit output and includes a first transimpedance amplifier having a first input and a first output, and a second transimpedance amplifier having a second input and a second output where the second transimpedance amplifier being coupled in a push-pull arrangement with the first transimpedance amplifier.

32 Claims, 10 Drawing Sheets

FIELD EFFECT TRANSISTOR CABLE TELEVISION LINE AMPLIFIER

BACKGROUND OF THE INVENTION

Benefit of the priority of the Jul. 27, 1995 filing date of provisional application Ser. No. 60/001,557 is hereby claimed.

1. Field of the Invention

The present invention relates to line amplifiers as used in cable access television distribution networks. In particular, the invention relates to line amplifiers which use gallium arsenide field effect transistors.

2. Description of Related Art

Cable Access Television (CATV) systems have, as their main component, distribution amplifiers for distributing hundreds of cable television channels to subscribers of cable television systems. These distribution amplifiers include various level and tilt control circuits, as well as power coupling and/or splitting devices, but incorporate as their main function power amplification devices which extend the distance from a service provider that a subscriber may be located.

These power amplifier devices are designed specifically for the requirements of the CATV industry. The main concern, second only to bandwidth, is low distortion of the signals as they are amplified throughout the system. Noise is also of concern, but due to the gain in the amplifiers themselves and the output power levels at which these amplifiers are operated (hence the need for low distortion) this is usually less of a concern in a correctly designed system. However, less noise does mean better performance for the end user.

In the past, the only active device technology available for the design of these power amplifiers has been bipolar junction transistors (BJT's), whether used in discrete form or in a hybrid circuit.

Performance of the BJT, as an active device used in the design of medium power amplifiers, has certain limitations. These limitation that concern CATV amplifier design are bandwidth and distortion. As the signal bandwidth requirement of the CATV industry grows, so does the need for larger bandwidth devices. Increasing the bandwidth of BJT devices requires decreasing the physical size of the device to decrease the electrical parasitic effects inherent in the device geometry. A decrease in the physical size of the device limits the internal power dissipation capabilities of the device and hence the inherent abilities of the BJT to amplify power signals linearly. As the internal power dissipation capability of the device decreases, the internal temperature of the device increases. This rise in temperature of the device necessitates special packaging design considerations, making the design of the amplifier more costly and less reliable. Excessive internal heating of the device also causes the device to exhibit unexpected distortions.

Alternatively, increased bandwidth implies more signals and hence larger power amplification requirements. Larger power amplification requirements necessitate larger internal power dissipation requirements of the device, which by the previous discussion impedes larger bandwidth requirements. In summary, larger bandwidth requirements and low distortion are not mutually independent concerns in line power amplifier designs; the demand for one often conflicts with the design requirements of the other.

Current topologies used in the design of bipolar junction transistor (BJT) cable access television (CATV) power amplifiers are "push pull" and "power doubling" (or "parallel hybrid").

Figure 1:
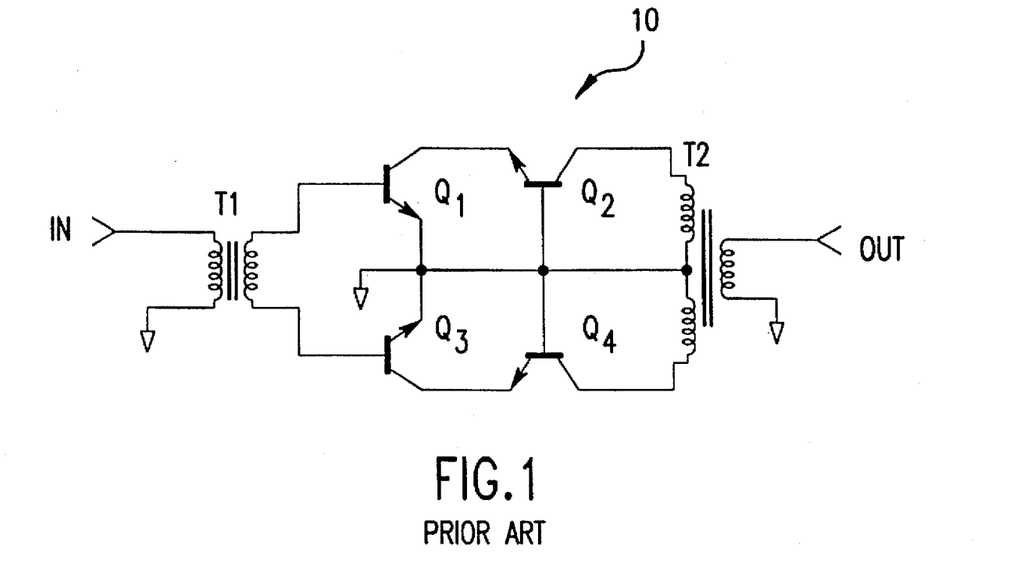
FIG. 1 is a circuit schematic of a conventional bipolar junction transistor amplifier circuit.

FIG. 1 shows a typical device configuration for a typical BJT (cascode) push pull amplifier 10. The rudiments of the push pull design are shown in the design of T1 and T2. T1 serves as an unbalanced to balanced line power splitting device and matches the paralleled input impedances of Q1 and Q3 to the system impedance. Q1 and Q3 are identical transistors. T2 serves as a balanced to unbalanced line power combining device and matches Q2 and Q4 output impedances to the system impedance. Q2 and Q4 are identical devices. Q1 and Q2, as well as Q3 and Q4, form cascode amplifier pairs. The fundamental signals are split, amplified in identical cascoded amplifiers and then recombined so that the resulting fundamental signals are congruous, phase coherent and add constructively. However, during the amplification process, the fundamental signals are distorted by the non-linearities of the devices used in the cascode amplifiers, generating both odd and even distortion signals. The importance of push-pull design is that the even order distortion products, generated from each of cascode amplifiers, are also congruous but are directly opposite in phase and add destructively. The cascode amplifier has superior performance characteristics for BJT designs. What is significant is that an amplifier device can have an overall fundamental improvement in performance as a linear power amplifier when used in a push pull configuration, with almost equal gain performance. Since each individual amplifier pair in the push pull design amplifies less signal power than would need to be amplified in a single amplifier design and even order distortion signal cancellation is achieved, distortion performance of the overall amplifier will be significantly improved.

Figure 2:
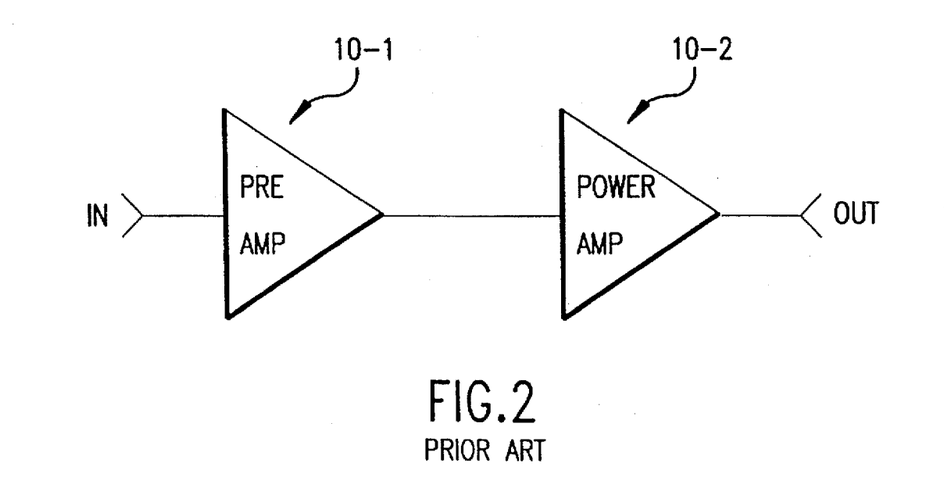
FIG. 2 is a block diagram of two amplifiers configured in tandem as pre-amplifier followed by a power amplifier.

FIG. 2 shows the power doubling (or parallel hybrid) configuration. Improvement in distortion characteristics of the overall amplifier is achieved through distribution of gain requirements between the two stages 10-1 and 10-2. Although overall power dissipation requirements are greater than are required with the push pull design (which is of significant concern in hybrid designs), the individual internal power dissipation requirements of each device is usually less.

Figure 3:
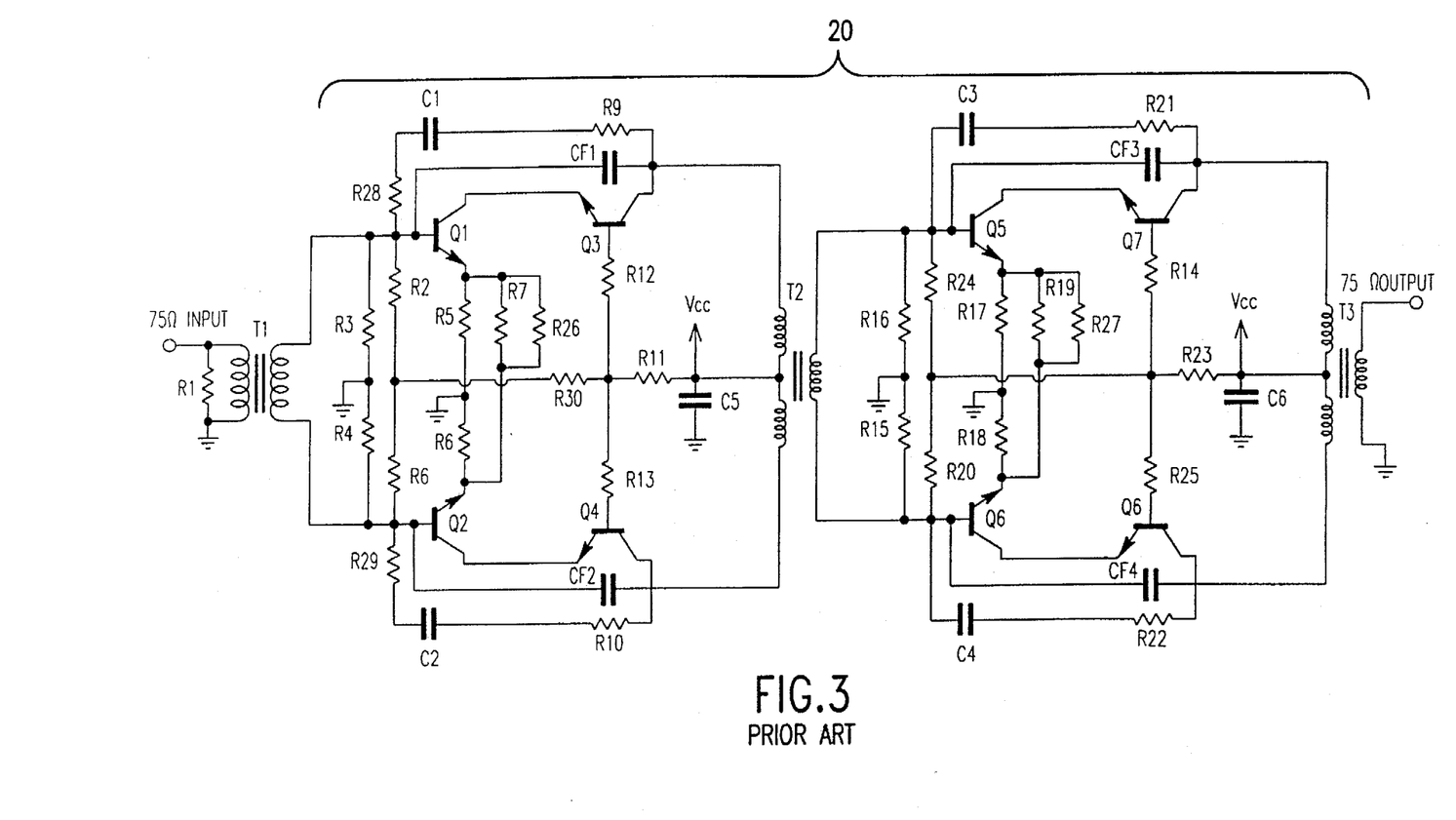
FIG. 3 is a circuit schematic of a conventional bipolar junction transistor amplifier circuit.

FIG. 3 shows a circuit of a conventionally used CATV power amplifier 20. This circuit, which is a power doubling (cascode) device, is implemented onto a single ceramic substrate. A single substrate improves bandwidth performance of the device and conserves space but has the disadvantages of increased power density and required special packaging. In this design T1 and T3 serve the same purposes as stated previously for the input and output power splitting/coupling. T2 serves a dual role of both functions. R28, C1, R9 and CF1 (and similar components) serve as feedback components. These components set the signal gain characteristics of the individual amplifiers. They aim affect the stability and the equivalent terminal impedance of each device. C5 and C6 serve as DC decoupling devices. All other resistors serve the purpose of biasing the transistor devices and setting the input and output terminal impedances. Distortion characteristics of the individual devices are determined by the DC biasing point.

Figure 11:
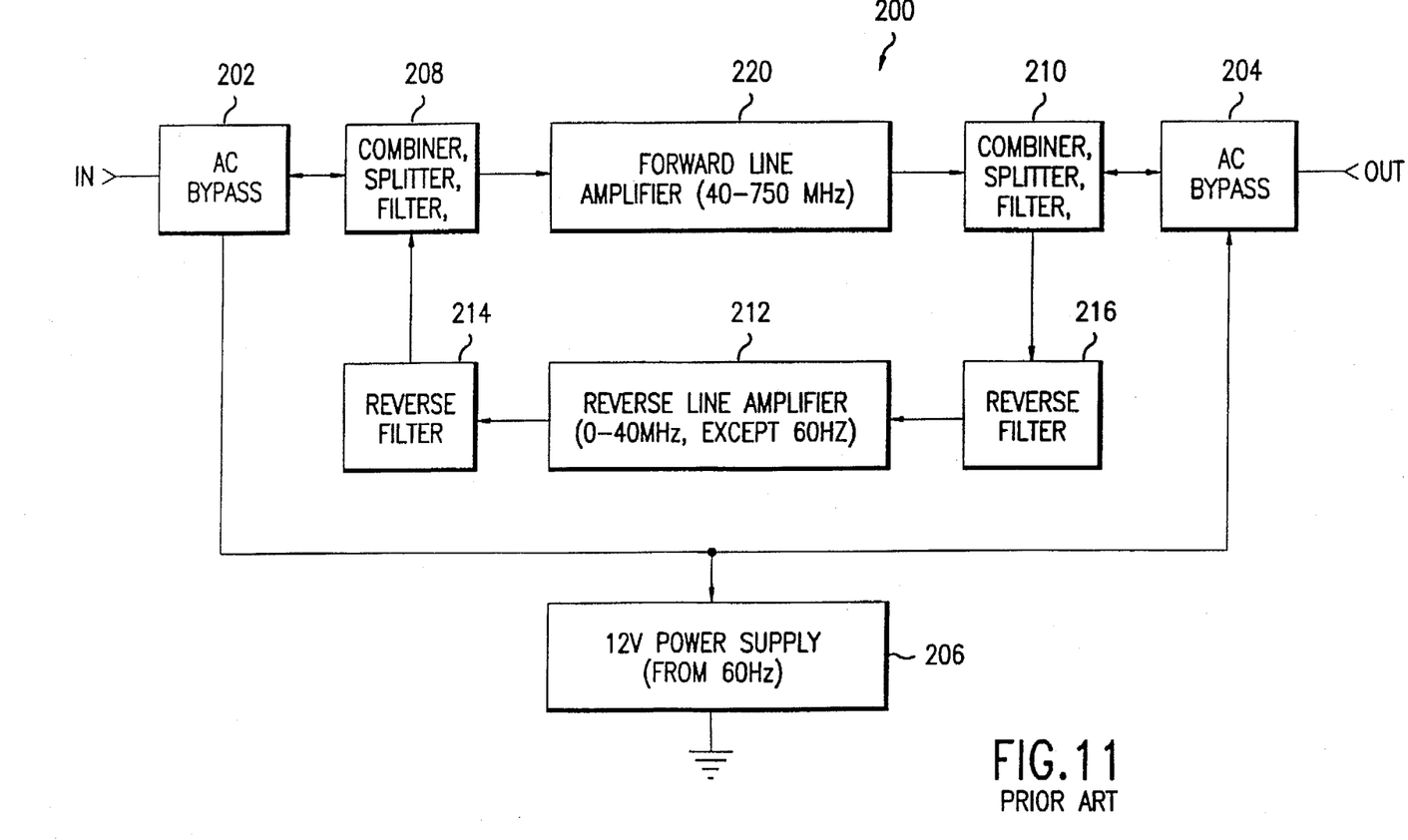
FIG. 11 is a block diagram of a CATV distribution fine amplifier in which the present invention is installed.

FIG. 11 depicts a representative CATV distribution line amplifier 200. Line amplifier 200 includes power circuits 202, 204 and 206; reverse line amplifier circuits 208, 210, 212, 214, 216; and forward line amplifier circuits 208, 210, 220. Of the power circuits, AC bypass circuits 202 and 204 separate power carrying frequencies (e.g., 50 Hz, 60 Hz, 400 Hz, 900 Hz) from RF frequencies (e.g., greater than 1 MHz). The power carrying frequency signals are provided by AC bypass 202 to 12 volt power supply 206 and AC bypass 204.

12 volt power supply 206 provides power for the operations of power consuming circuit parts 208 through 220. Power carrying frequency signals from AC bypass 202 are also provided to AC bypass 204 where the power carrying frequency signals carry power to the OUT terminal and to other circuits further down the distribution lines of the CATV distribution network.

After removing power carrying frequency signals, the remaining frequency signals are provided to combiner, splitter, filter 208 (from terminal IN) or to combiner, splitter, filter 210 (from terminal OUT). The function of combiner, splitter, filter 208 sometimes referred to as a diplex filter is to separate high frequency signals used in forward transmission from low frequency signals typically used in reverse transmission. For example, forward transmission signals may be carried within the frequency band 40 MHz to 750 MHz. Thus, combiner, splitter, filter 208 passes signals with frequencies between 40 MHz and 750 MHz from AC bypass 202 through to forward line amplifier 220. Reverse line amplifier 212 amplifies reverse transmission signals transmitted generally from terminal OUT to terminal IN. Reverse filter 214 is preferably a low pass filter to pass signals below, for example, 40 MHz. Combiner, splitter, filter 208 passes signals from reverse filters 214 through combiner, splitter, filter 208 through AC bypass 202 to terminal IN.

Forward line amplifier 220 amplifies transmission signals within a bandpass, for example, between 40 MHz and 750 MHz. These signals are passed through combiner, splitter, filter 210 through AC bypass 204 to terminal OUT. Reverse transmission signals (e.g., signals having a frequency less than 40 MHz) pass from terminal OUT through AC bypass 204 through combiner, splitter, filter 210 to reverse filter 216. Reverse filter 216 is preferably a low pass filter (e.g., passing frequencies less than 40 MHz).

Figure 12:
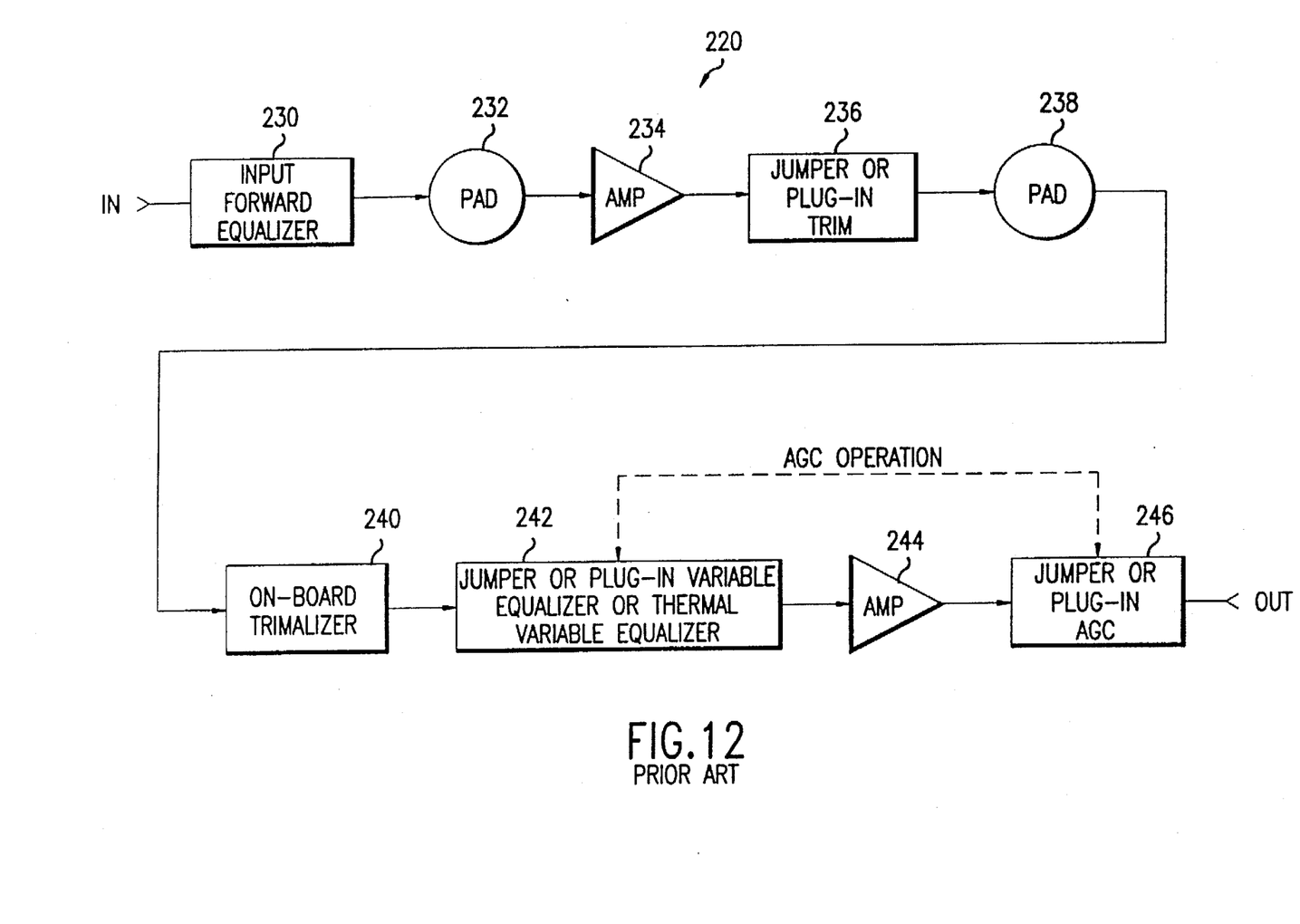
FIG. 12 is a block diagram of a forward line amplifier in which the present invention is installed.

In FIG. 12, forward line amplifier 220 is shown in greater detail. Typically, forward line amplifier 220 processes signals in the forward direction (e.g., transmission signals in a bandpass between 40 MHz and 750 MHz) through several stages. From its input terminal IN, signals are passed through input forward equalizer 230, through pad 232 (i.e., an attenuator) to amplifier 234. Signals from amplifier 234 are passed through jumper or plugged-in trim circuit 236, through pad 238 through onboard trim equalizer 240 through jumper or plugged-in variable equalizer or thermal variable equalizer 242 to amplifier 244. Signals from amplifier 244 pass through jumper or plug-in AGC to output terminal OUT. Circuits 230, 236, 240, 242 and 246 typically include jumpers to bypass other more complicated circuitry so that forward line amplifier 220 may be easily configured by a technician to match any particular application. The functions of these circuits are to equalize amplitudes at all frequencies within the bandpass, and compensate for loss of equalization due to thermal conditions as well as provide an automatic gain control (i.e., circuits 242 and 246). Amplifiers 234 and 244 are the subject of the present invention.

SUMMARY OF THE INVENTION

It is an object to the present invention to overcome disadvantages in the prior art. It is a further object of the present invention to provide a wide band, low distortion line amplifier which consumes low power.

These and other objects are achieved in an amplifier circuit for a cable access television line amplifier, the amplifier circuit having a circuit input and a circuit output. The amplifier circuit includes a first cascode amplifier having a first input and a first output, and a second cascode amplifier having a second input and a second output where the second cascode amplifier is coupled in a push-pull arrangement with the first cascode amplifier. The amplifier circuit further includes input circuitry for coupling the circuit input to the first and second inputs and output circuitry for coupling the first and second outputs to the circuit output. The first cascode amplifier includes a first field effect transistor coupled to the first input; the second cascode amplifier includes a second field effect transistor coupled to the second input; the first cascode amplifier further includes a third field effect transistor coupled to the first output; and the second cascode amplifier further includes a fourth field effect transistor coupled to the second output.

These and other objects are achieved in an alternative amplifier circuit for a cable access television line amplifier, the amplifier circuit having a circuit input and a circuit output. The amplifier circuit includes a first transimpedance amplifier having a first input and a first output, and a second transimpedance amplifier having a second input and a second output where the second transimpedance amplifier is coupled in a push-pull arrangement with the first transimpedance amplifier. The amplifier circuit further includes input circuitry for coupling the circuit input to the first and second input, and output circuitry for coupling the first and second outputs to the circuit output. The first transimpedance amplifier includes a first field effect transistor with a gate coupled to the first input and a drain coupled to the first output; the second transimpedance amplifier includes a second field effect transistor with a gate coupled to the second input and a drain coupled to the second output; the first transimpedance amplifier further includes a third field effect transistor as an active load coupled to the first output so as to provide feedback; and the second transimpedance amplifier further includes a fourth field effect transistor as an active load coupled to the second output so as to provide feedback.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention concerns the application of Gallium Arsenide Field Effect Transistor (GaAsFET) technology to CATV distribution amplifiers.

Due to the physical construction and the associated operational physics of FET devices, certain inherent characteristic advantages exist in FET amplifier designs over designs incorporating BJT devices. These are, in order of importance to CATV, bandwidth, distortion and noise. All of these aspects have foundations theoretically developed, through the application of mathematical models (which describe the electrical operation of the device), in various literature. These aspects also have been demonstrated in some applications of these devices.

As in any design, there are certain advantages and disadvantages to applying a certain technology to a given application. From the very beginnings of the CATV industry, the only commercially available active device technology that was applicable was the BJT. In the past decade, FET devices have become available for commercial use, but only at greater economic expense to the user than BJT's. Therefore, they were only used in "high-end" applications where performance requirements justified the increased cost, and then only in low power applications. There were no "medium" to "high" power devices available. Advances in gallium arsenide fabrication technology, as well as economic circumstances in the electronics industry, have created a situation whereby FET devices (and technology) may now be considered suitable for CATV amplifier designs, in terms of cost and performance.

The performance advantages of the FET, as an active device, used in the design of medium power amplifiers are bandwidth, distortion and noise. Bandwidth advantages are obtained primarily because of the fabrication geometry necessary to elicit an electrical response associated with the FET (physical) device operation. GaAsFETs normally have excellent parasitic behavior due to material properties and device geometry. Gain-Bandwidth products for GaAsFETs are superior to those of BJT devices, for equal internal average power dissipation designs. Distortion advantages are associated with the nonlinear characteristic operation of the FET device itself. FET devices exhibit square law nonlinear properties in response to large input signal excitations, while BJT devices exhibit exponential properties. Since the "order" of the FET nonlinearity (i.e., square law) is less than the "order" of BJT nonlinearity (i.e., exponential having cubic and higher order components), so is the distortion for a given signal excitation and again, for equal internal average power dissipation. Noise advantages in GaAsFETs are due to material properties and device construction also.

Figure 4:
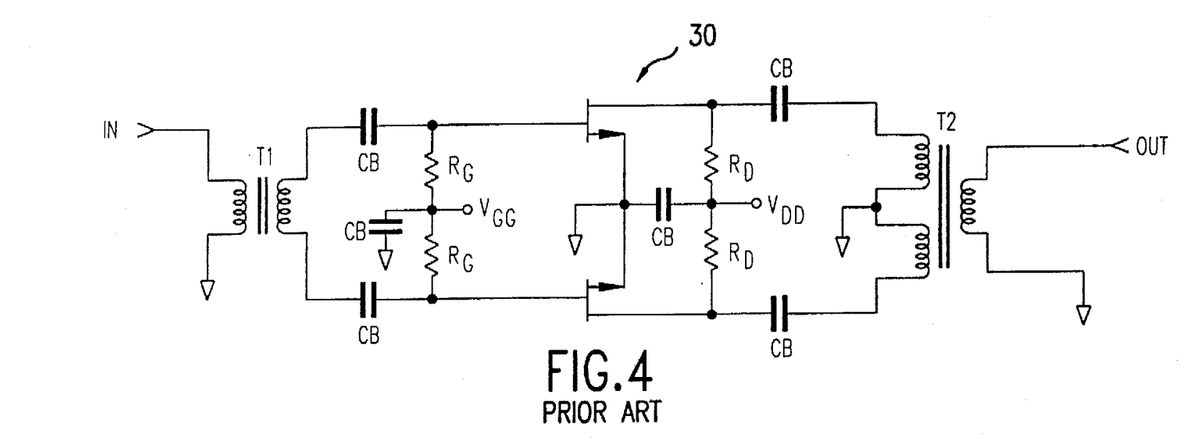
FIG. 4 is a circuit schematic of a push-pull single stage FET power amplifier.

FIG. 4 shows a simplified version of a push pull, single stage, FET power amplifier 30. T1 and 72 serve the same purposes as previously explained for a push pull amplifier design. Capacitor CB is for DC decoupling. Since FET devices are very accurately modeled as voltage controlled current sources, they exhibit very nearly ideal amplifier characteristics of infinite input and large output impedances. Therefore, RG and RD serve as input and output impedance terminations. Bias conditions (and therefore gain and distortion characteristics) are primarily set with VGG. Correctly chosen design values for VDD and RD allow for signal amplification without distortion due to waveform "clipping".

Figure 5:
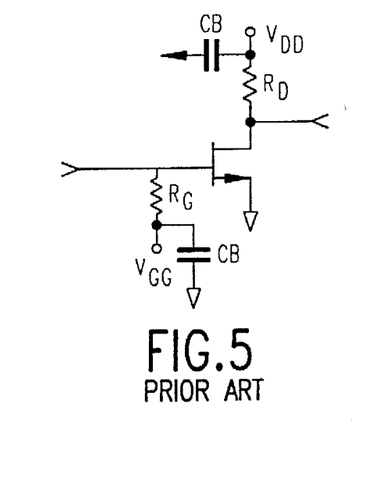
FIG. 5 is a circuit schematic of a bias configuration of the FET device depicted in FIG. 4.

FIG. 5 shows a common bias configuration for a FET device and is the one used in FIG. 4. However, there are some drawbacks to this configuration. FET's, at frequencies of interest to CATV, are normally unstable. Values of RD needed to achieve broadband frequency stability will often conflict with those needed to achieve other performance requirements such as device gain. Frequency stability in practice is often best achieved through negative feedback compensation. Bias stability and constant impedance design can also often be best achieved through negative feedback compensation.

Figure 6:
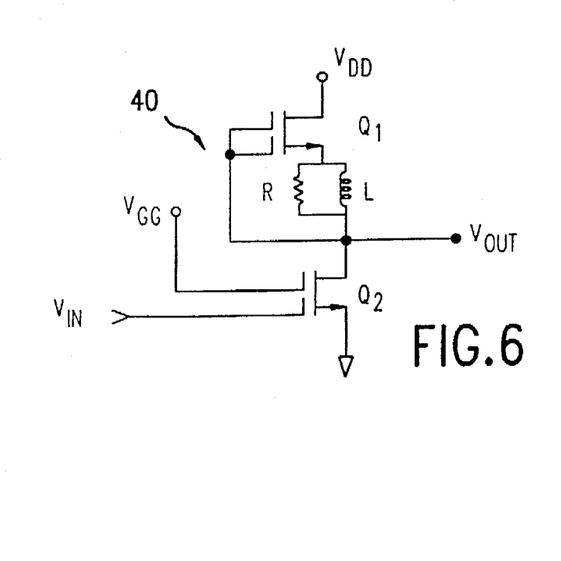
FIG. 6 is a circuit schematic of a transimpedance amplifier with active load used for feedback.

The ideal amplifier for a CATV application would be one which exhibits the properties of large bandwidth, low noise and high voltage gain with minimum supply (bias) voltage and power requirements. FETs may be so configured. In particular, FETs maybe configured as a so-called "transimpedance" amplifier design. Referring to FIG. 6, transimpedance amplifier 40 is normally used as low noise, voltage amplifiers for diode detector and transmitter devices. An example of such an application would be laser diode detectors and transmitters used in fiber optic equipment and technology. The FETs used in such designs are often "Dual Gate MESFETs". Dual gate structures allow the FET to be DC biased from a different gate pin than from the gate pin where a radio frequency signal is applied. This can offer performance advantages as well as biasing advantages. This structure also includes Q1, which together with R and L provides an active load that incorporates into its structure feedback advantages. Bias, gain and stability all can be achieved through this and similar designs.

Figure 7:
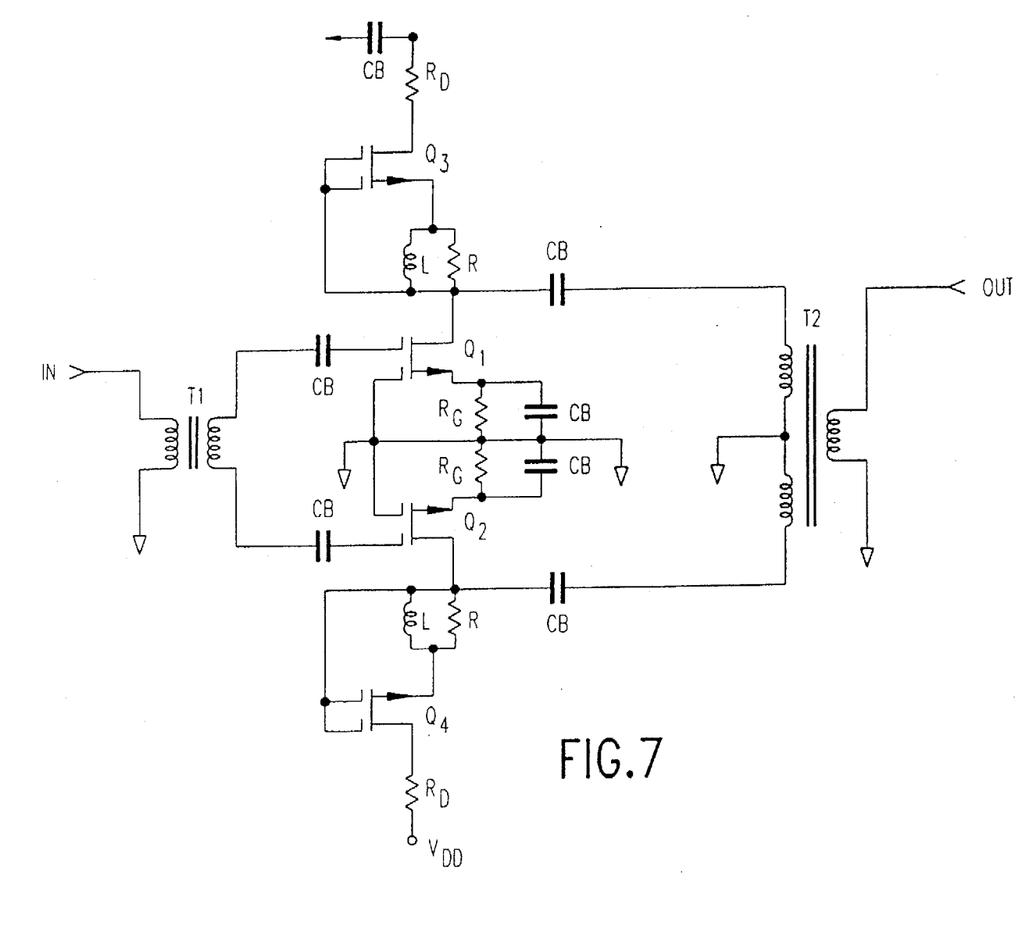
FIG. 7 is a circuit schematic of two tansimpedance amplifiers with active loads coupled in a push-pull arrangement.

FIG. 7 shows a push pull arrangement of structures of the type discussed with respect to FIG. 6. Such an arrangement is a preferred arrangement as an amplifier in a CATV power amplifier design in accordance with one embodiment of the present invention.

Figure 8:
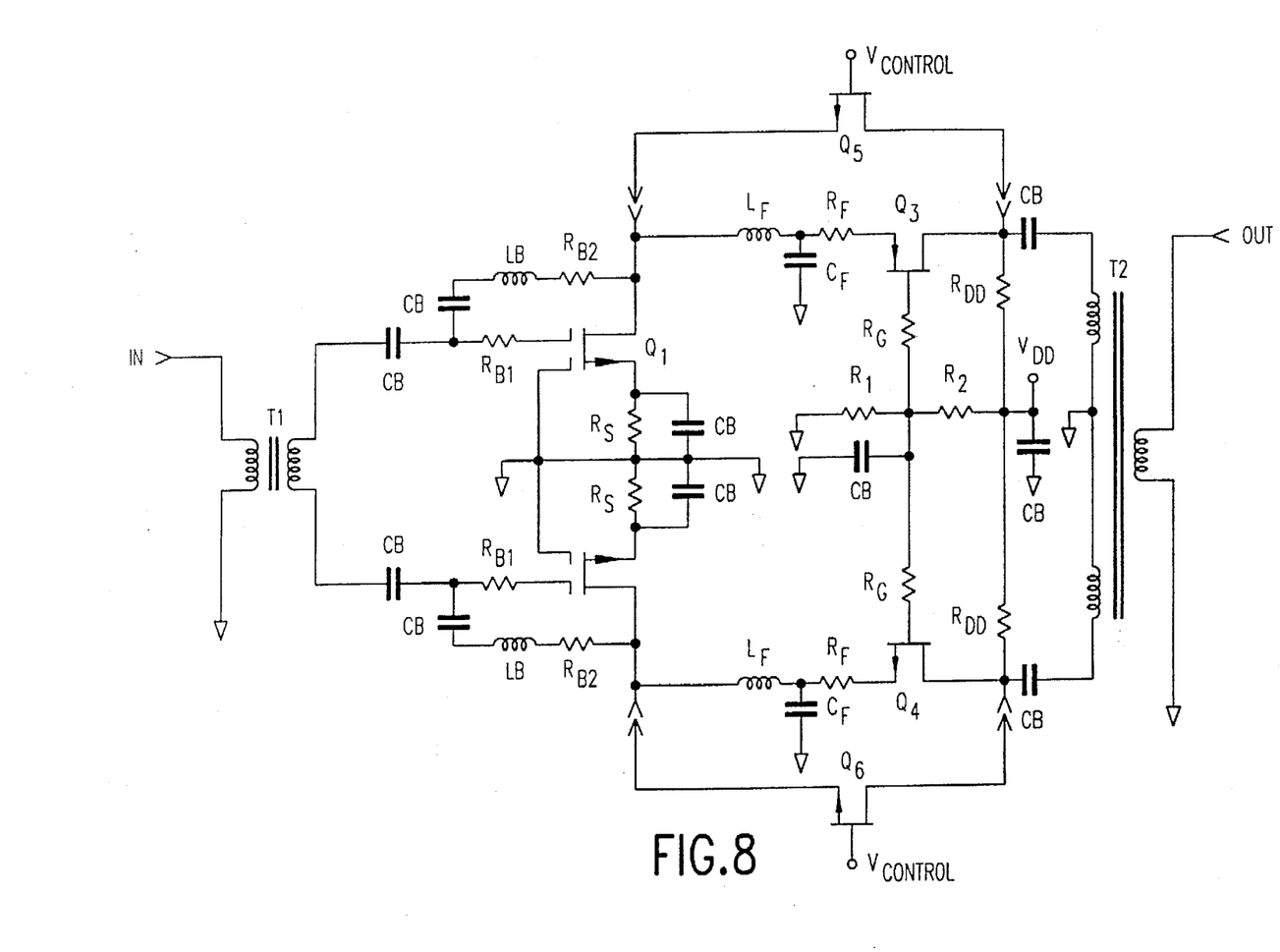
FIG. 8 is a circuit schematic of two cascode amplifiers with active feedback for automatic/manual gain control coupled in a push-pull arrangement.

In FIG. 8, Q1 and Q3, as well as Q2 and Q4, form cascode amplifier pairs configured in a push pull arrangement. In this topology, each Rs serves to correctly bias the gate to source voltage of its respective (MESFET) transistor Q1 and Q2, for operation. T1 and T2 serve the same purpose as previously stated for the "push-pull" amplifier design. RB1, RB2 and LB serve the special purpose of feedback control. The gain and stability, as well as input and output impedances, are effected by the choices of value of these components, for Q1 and Q2. $L_F$, $C_F$ and $R_F$ form a low pass filter and interstage impedance match. The gain, stability and frequency response of the amplifier as a whole are effected by these components. $R_{DD}$, and to a lesser extent $R_F$, are chosen to give the desired drain to source voltage for transistors Q3 and Q4. $R_{DD}$, also has the dual role of setting the output impedance of the (output) amplifier stage. $R_G$ is a feedback component for Q3 and Q4. $R_G$ helps set the output gain and terminating impedance for transistors Q3 and Q4. R1 and R2 help set the gate to source voltage of transistors Q3 and Q4, for proper biasing.

The cascode amplifier has a beneficial characteristic in that it is well suited for designs in which the gain of an amplifier needs to be variable. Hence, the cascode amplifier is well suited as an amplifier that inherently has the means to have an internal, or better "a self-adjusting", gain control (i.e. "AGC"). This can be demonstrated in the amplifier in FIG. 8 as follows. If R2 and/or R1 were made to be variable, then the gate to source voltage of transistors Q3 and Q4 would be made to vary. This in turn would variably adjust the bias of transistors Q3 and Q4. This effect ultimately adjusts the power gain of the amplifier.

A limitation of such a gain control design (i.e., adjusting R1, R2) is the effect on distortion characteristics of the amplifier that would result from varying the bias of the amplifier. Since GaAsFETs are also suited to use as variable resistors, a better mechanism for amplifier gain control is demonstrated in FIG. 8 with the incorporation of transistors Q5 and Q6. Since transistors Q5 and Q6 are directly coupled to the output amplifier stage of the cascode amplifier they will divert a certain amount of DC current through them. However, this should not pose a problem to the circuit if the correct value of gate to source voltage (e.g., Vcontrol) is chosen. If a "lightly biased" condition exists, or equivalently, if Vcontrol is such that the drain to source current through Q5 and Q6 is small compared to the drain to source current that flows through Q3/Q1 and Q4/Q2, then Q5 and Q6 will act as feedback resistors on the cascode amplifier output stage. Varying the DC current through Q5 and Q6, by the value of Vcontrol, allows the control of gain in the cascode amplifier. As indicated, all transistors Q1–Q6 comprise field effect transistors lending the circuit to monolithic integration.

Preferably, individual amplifier circuits are fabricated monolithic integrated circuits in the gallium arsenide technology. However, the amplifier circuit of the invention may include plural individual monolithic integrated amplifier circuits arranged in tandem as depicted in FIG. 2. Each monolithic integrated amplifier circuit operates in cooperation with "external" biasing and embedding circuitry.

Figure 9:
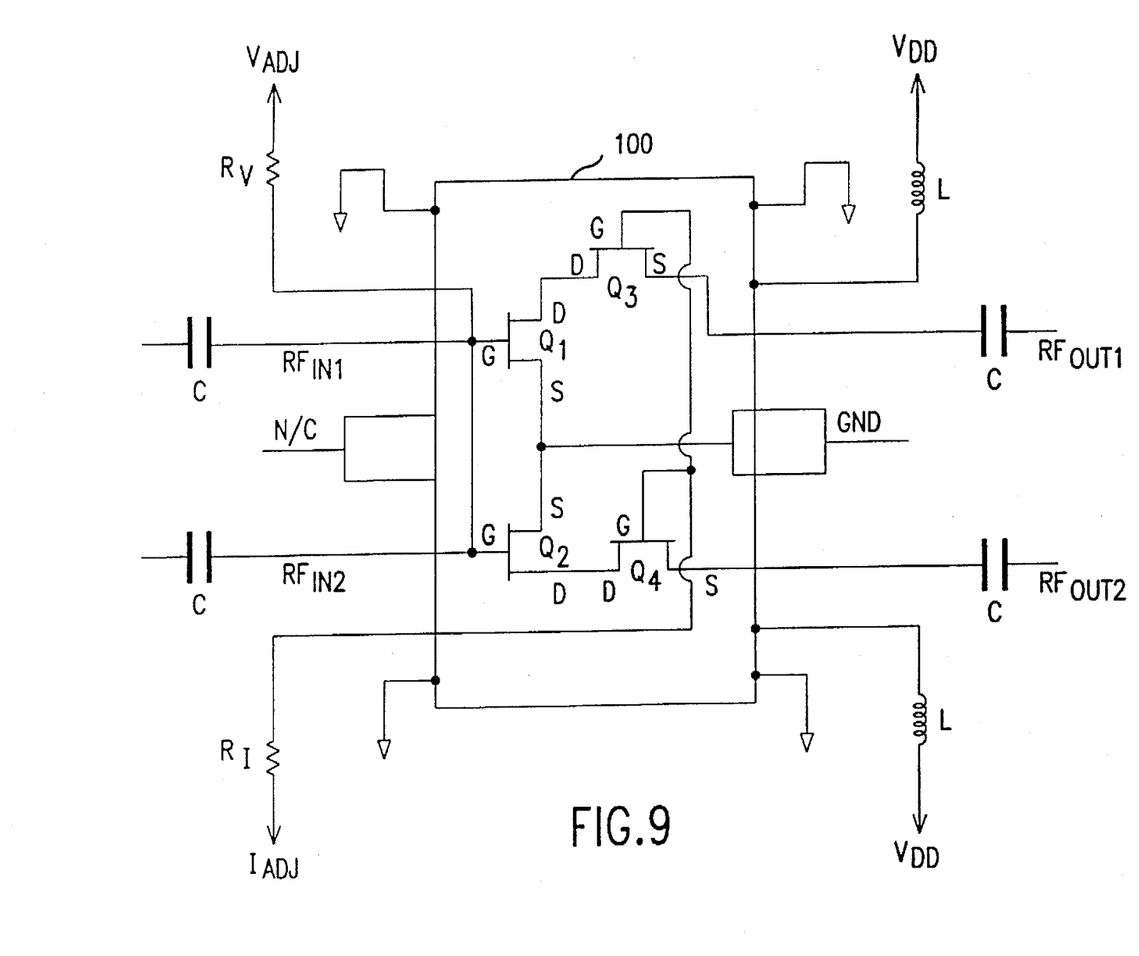
FIG. 9 is an equivalent schematic diagram of a monolithic integrated amplifier circuit according to the invention.

FIG. 9 is a simplified equivalent circuit schematic depicting an example of the control components of the monolithic integrated amplifier circuit with associated biasing and embedding circuitry. In FIG. 9, monolithic integrated amplifier circuit 100 is shown in substantially the same arrangement as depicted in FIG. 8 where transistor Q3, Q4 (FIG. 9) correspond to Q5 and Q6 of FIG. 8; however, filter components $L_F$, $R_F$ and $C_F$ (FIG. 8) are shown removed (other than parasitic impedances) and feedback bias components $C_B$, $L_B$ and $R_{B2}$ (FIG. 8) are shown removed (other than parasitic impedances) for better high frequency performance and integration in a monolithic circuit but may be intended depending on the application. In FIG. 9, Q1 and Q2 are preferably dual gate FETs. A first gate of each FET is coupled respectively through d.c. blocking (RF passing) capacitors C as $RF_{m1}$ and $RF_{m1}$, respectively. The second gate of each transistor is coupled through $R_v$ to $V_{ADJ}$ to adjust the bias point by adjusting gate to source bias voltage. Similarly, the gates of transistors Q3 and Q4 are coupled through resistor $R_I$ to $I_{ADJ}$ to adjust the current bias in transistors Q3 and Q4 and thereby control feedback. RF choke inductors L are provided between voltage source $V_{DD}$ and the power input to integrated circuit 100. Outputs of integrated circuit 100 are coupled respectively through d.c. blocking (RF passing) capacitors C as $RF_{out1}$ and $RF_{out2}$, respectively.

Figure 10A:
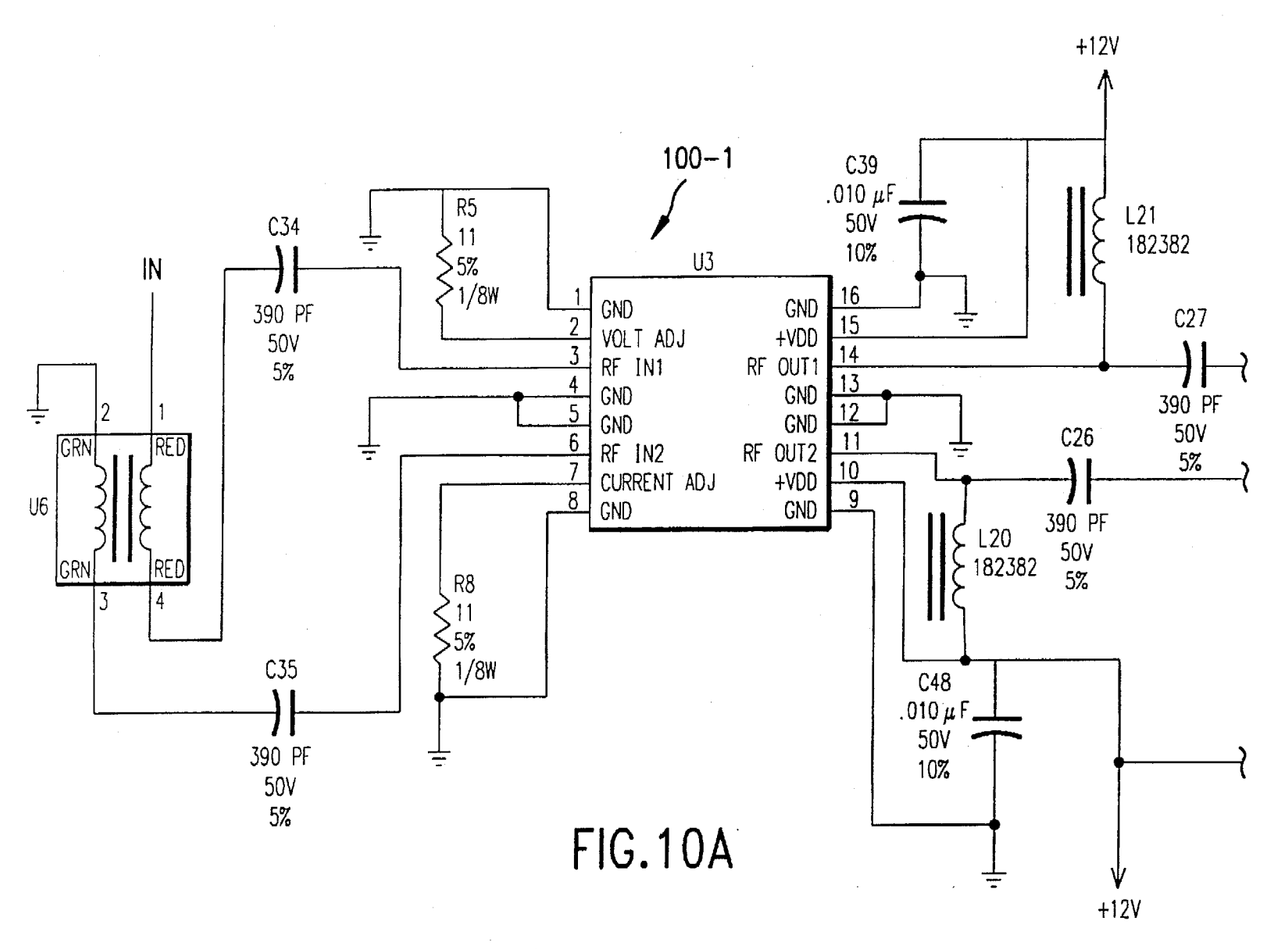
FIG. 10 is a schematic/block diagram of a two stage amplifier circuit according to the invention.
Figure 10B:
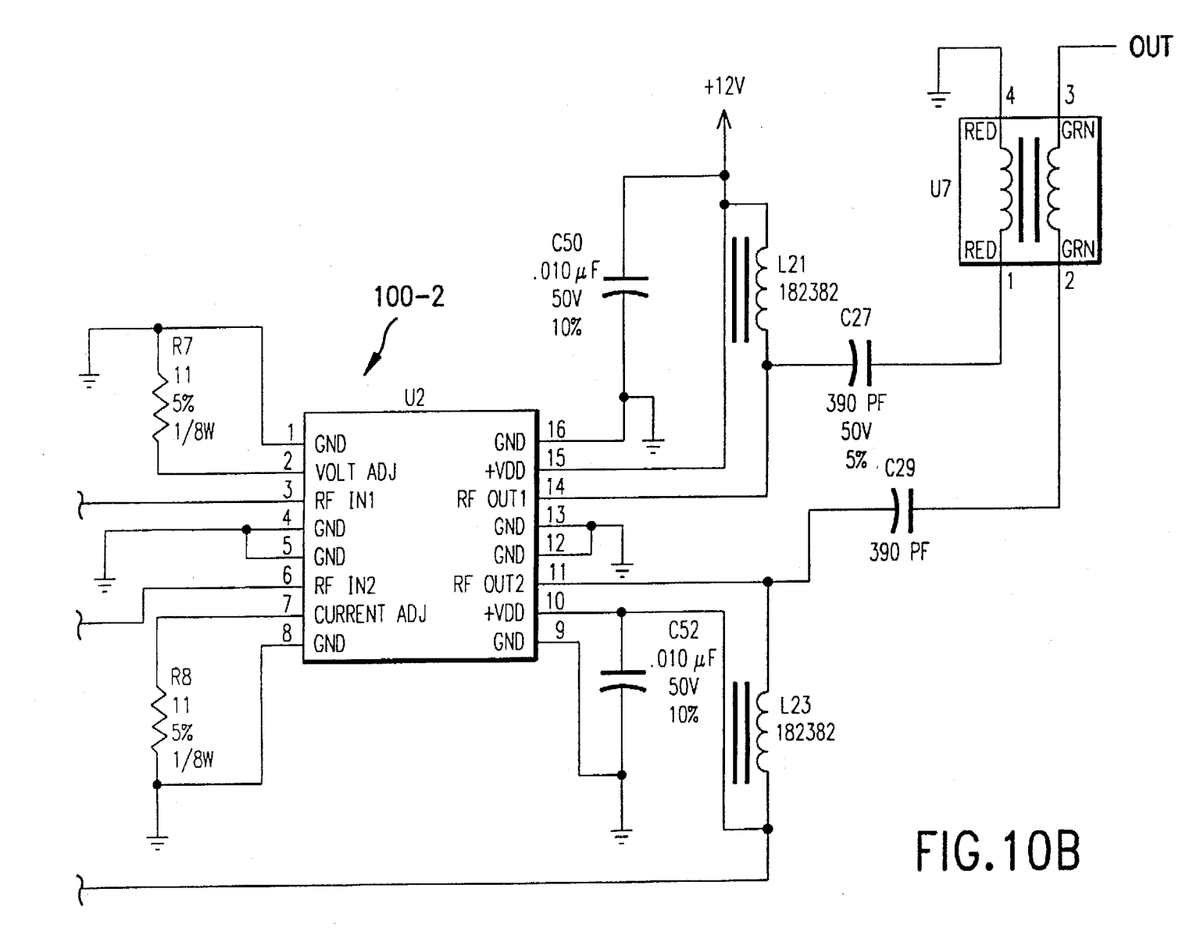

FIG. 10 depicts a preferred amplifier circuit (such as amplifier 234 or 244 of FIG. 12) having first amplifier circuit part 100-1 and second amplifier circuit part 100-2 coupled in tandem as shown in FIG. 2. First amplifier circuit part 100-1 has associated with it RF choke inductors L20 and L21 (corresponding to RF choke inductors L in FIG. 9), voltage adjust resistor R5 (corresponding to resistor $R_v$ in FIG. 9), current adjust resistor R6 (corresponding to resistor $R_I$ in FIG. 9), input d.c. blocking capacitors C34, C35 (corresponding to blocking capacitors C in FIG. 9), monolithic integrated amplifier circuit U3 (corresponding to integrated circuit 100 in FIG. 9) and power source to ground a.c. bypass capacitors C39, C48. Second amplifier circuit part 100-2 has associated with it RF choke inductors L22 and L23 (corresponding to RF choke inductors L in FIG. 9), voltage adjust resistor R7 (corresponding to resistor $R_v$ in FIG. 9), current adjust resistor R8 (corresponding to resistor $R_I$ in FIG. 9), output d.c. blocking capacitors C28, C29 (corresponding to blocking capacitors C in FIG. 9), monolithic integrated amplifier circuit U2 (corresponding to integrated circuit 100 in FIG. 9) and power source to ground a.c. bypass capacitors C50, C52. First and second amplifier circuit parts 100-1 and 100-2 are coupled through interstage d.c. blocking capacitors C26, C27 (corresponding to d.c. blocking capacitors C in FIG. 9).

In FIG. 10, the amplifier circuit includes input balun type transformer U6 (corresponding to input transformer T1 in FIG. 8) and output balun type transformer U7 (corresponding to output transformer T2 in FIG. 8). Proper selection of resistors R5–R8 will control operating conditions in integrated circuits U2, U3 to provide stability, gain over the bandwidth (i.e., 40 MHz to 750 MHz), etc.

The circuit of FIG. 10 demonstrates improved performance over conventional BJT). For example, performance improvements are achieved in gain flatness, return loss, noise figure, and composite second order distortion.

Each integrated amplifier circuit (e.g., U2 and U3) is preferably designed to provide optimized performance (e.g., gain, bandwidth, low distortion, etc.) when operated at the designed bias point. For example, pre-amp 10-1 (FIG. 2) may be designed to operate at a lower bias current than is power amp 10-2 (FIG. 2). The current through the integrated amplifier circuit defines its power dissipation and is largely controlled by $V_{ADJ}$ (FIG. 9) or VOLT ADJ (FIG. 10).

To afford greater flexibility to a designer, a family of integrated amplifier circuits are designed, each member of the family being designed to optimally operate at different bias points (e.g., 200 ma., 275 ma., 330 ma. and 515 ma.). For example, the designer of the circuit shown in FIG. 10 may choose integrated amplifier circuit U3 to operate at 200 ma. and choose integrated amplifier circuit U2 to operate at 330 ma. Alternatively, a designer may select integrated amplifier circuits U3 and U2 to operate at 275 ma. and 515 ma., respectively. In this way the designer can obtain optimal performance while minimizing the power consumed in the integrated amplifier circuits, the CATV line amplifier and the greater CATV signal distribution network. Any of these integrated amplifiers (e.g., U2 or U3 in FIG. 10) may be removably attachable to the amplifier circuit by a connection, for example, by plug-in sockets or by solder connections.

Balun type transformers U6, U7 are broadband balanced to unbalanced transformers, preferably formed around toroidally shaped ferrite cores (e.g., 0.133"–0.143" outer diameter, by 0.067"–0.073" inner diameter, by 0.047"–0.053" in thickness as core type 43 produced by, for example, Fair-Rite Products Corp., Wallkill, N.Y.). The baluns are so configured that an input impedance at terminal IN matches a paralleled impedance at terminal RF IN1 and terminal RF IN2 of monolithic integrated amplifier U3 (FIG. 10) over a predetermined range of frequencies (e.g., 40 MHz to 750 MHz). The baluns are so configured that an output impedance at terminal OUT matches a paralleled impedance at terminal RF OUT1 and terminal RF OUT2 of monolithic integrated amplifier U2 (FIG. 10) over the predetermined range of frequencies. The magnetic core of input balun U6 is preferably saturable so that terminal IN is insensitive to static discharge (FIG. 10); the magnetic core of output balun U7 is preferably saturable so that terminal OUT is insensitive to static discharge (FIG. 10). The core is wound with ten turns each winding of bifilar wound double coated known in part as "heavy build" 34 gauge wire to achieve <2 degrees of phase offset from 180 between output arms 1 and 2 over the band pass (i.e., 40 MHz to 750 MHz), <0.5 dB amplitude imbalance between output arms 1 and 2 over the band pass, and <0.75 dB insertion loss at 750 MHz on each arm. The RF power at terminal IN is split into substantially equal parts at terminals RF IN1 and RF IN2 of U3 in FIG. 10, less the insertion loss. The RF power at terminals RF OUT1 and RF OUT2 of U2 in FIG. 10 are combined and provided at terminal OUT in FIG. 10, less insertion loss.

Thus, input balun U6 is capable of splitting an input signal at input terminal IN into a first signal at terminal RF IN1 of U3 and a second signal at terminal RF IN2 of U3 (FIG. 10) such that a phase difference between the first signal and the second signal is 180 degrees plus or minus a phase offset, the phase offset being no more than 2 degrees over a predetermined range of frequencies (e.g., 40 MHz to 750 MHz), a first amplitude of the first signal being equal to a second amplitude of the second signal plus or minus an amplitude imbalance, the amplitude imbalance being no more than 0.5 dB over the predetermined range of frequencies. Similarly, output balun U7 is capable of combining a first signal from terminal RF OUT1 of U2 with a second signal from terminal RF OUT2 of U2 to form an output signal at terminal OUT (FIG. 10), a phase difference between the first signal and the second signal being 180 degrees plus or minus a phase offset, the phase offset being no more than 2 degrees over the predetermined range of frequencies, a first amplitude of the first signal being equal to a second amplitude of the second signal plus or minus an amplitude imbalance, the amplitude imbalance being no more than 0.5 dB over the predetermined range of frequencies.

Having described preferred embodiments of a novel gallium arsenide field effect transistor CATV line amplifier (which are intended to be illustrative and not limiting), it is noted that modifications and variations can be made by persons skilled in the art in light of the above teachings. For example, the amplifier circuit described herein may be employed in reverse line amplifier 212 or in forward line amplifier 220 of FIG. 11. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. In a cable access television line amplifier, an amplifier circuit having a circuit input and a circuit output, the amplifier circuit comprising:

a first amplifier having a first input and a first output;

a second amplifier having a second input and a second output, the second amplifier being coupled in a push-pull arrangement with the first amplifier;

input circuitry for coupling the circuit input to the first and second inputs; and output circuitry for coupling the first and second outputs to the circuit output, wherein the first amplifier includes a first field effect transistor coupled to the first input, wherein the second amplifier includes a second field effect transistor coupled to the second input, wherein the first amplifier further includes a third field effect transistor coupled to the first output, wherein the second amplifier further includes a fourth field effect transistor coupled to the second output;

wherein a fifth field effect transistor is coupled between the first transistor and the first output; and wherein a sixth field effect transistor is coupled between the second transistor and the second output.

2. The amplifier circuit of claim 1, wherein each of the first, second, third and fourth transistors is a gallium arsenide field effect transistor.

3. The amplifier circuit of claim 1, wherein:

the first amplifier is a first cascode amplifier; and the second amplifier is a second cascode amplifier.

4. The amplifier circuit of claim 3, wherein each of the first, second, third and fourth transistors are gallium arsenide field effect transistors.

5. The amplifier circuit of claim 3, wherein each of the first, second, third and fourth transistors are dual gate gallium arsenide field effect transistors.

6. The amplifier circuit of claim 1, wherein at least one of the input circuitry and the output circuitry includes a balun.

7. The amplifier circuit of claim 1, wherein the input circuitry includes a balun, the balun being capable of splitting an input signal at the circuit input into a first signal at the first input and a second signal at the second input, a first amplitude of the first signal being substantially equal to a second amplitude of the second signal, a phase difference between the first signal and the second signal being 180 degrees plus or minus a phase offset, the phase offset being no more than 2 degrees over a predetermined range of frequencies.

8. The amplifier circuit of claim 7, wherein the predetermined range of frequencies includes frequencies from 40 MHz to 750 MHz.

9. The amplifier circuit of claim 1, wherein the output circuitry includes a balun, the balun being capable of combining a first signal from the first output with a second signal from the second output to form an output signal at the circuit output, a first amplitude of the first signal being substantially equal to a second amplitude of the second signal, a phase difference between the first signal and the second signal being 180 degrees plus or minus a phase offset, the phase offset being no more than 2 degrees over a predetermined range of frequencies.

10. The amplifier circuit of claim 9, wherein the predetermined range of frequencies includes frequencies from 40 MHz to 750 MHz.

11. The amplifier circuit of claim 1, wherein the input circuitry includes a balun, the balun being capable of splitting an input signal at the circuit input into a first signal at the first input and a second signal at the second input, the first and second signals being substantially out of phase, a first amplitude of the first signal being equal to a second amplitude of the second signal plus or minus an amplitude imbalance, the amplitude imbalance being no more than 0.5 dB over a predetermined range of frequencies.

12. The amplifier circuit of claim 11, wherein the predetermined range of frequencies includes frequencies from 40 MHz to 750 MHz.

13. The amplifier circuit of claim 1, wherein the output circuitry includes a balun, the balun being capable of combining a first signal from the first output with a second signal from the second output to form an output signal at the circuit output, the first and second signals being substantially out of phase, a first amplitude of the first signal being equal to a second amplitude of the second signal plus or minus an amplitude imbalance, the amplitude imbalance being no more than 0.5 dB over a predetermined range of frequencies.

14. The amplifier circuit of claim 13, wherein the predetermined range of frequencies includes frequencies from 40 MHz to 750 MHz.

15. The amplifier circuit of claim 1, wherein the input circuitry includes a balun, the balun being capable of splitting an input signal at the circuit input into a first signal at the first input and a second signal at the second input, a phase difference between the first signal and the second signal being 180 degrees plus or minus a phase offset, the phase offset being no more than 2 degrees over a predetermined range of frequencies, a first amplitude of the first signal being equal to a second amplitude of the second signal plus or minus an amplitude imbalance, the amplitude imbalance being no more than 0.5 dB over the predetermined range of frequencies.

16. The amplifier circuit of claim 15, wherein the predetermined range of frequencies includes frequencies from 40 MHz to 750 MHz.

17. The amplifier circuit of claim 1, wherein the output circuitry includes a balun, the balun being capable of combining a first signal from the first output with a second signal from the second output to form an output signal at the circuit output, a phase difference between the first signal and the second signal being 180 degrees plus or minus a phase offset, the phase offset being no more than 2 degrees over a predetermined range of frequencies, a first amplitude of the first signal being equal to a second amplitude of the second signal plus or minus an amplitude imbalance, the amplitude imbalance being no more than 0.5 dB over the predetermined range of frequencies.

18. The amplifier circuit of claim 17, wherein the predetermined range of frequencies includes frequencies from 40 MHz to 750 MHz.

19. The amplifier circuit of claim 1, wherein at least one of the input circuitry and the output circuitry includes a balun and at least one capacitor.

20. The amplifier circuit of claim 1, wherein the input circuitry includes a balun and at least one capacitor selected so that an input impedance at the circuit input matches a paralleled impedance at the first and second inputs over a predetermined range of frequencies.

21. The amplifier circuit of claim 1, wherein the output circuitry includes a balun and at least one capacitor selected so that an output impedance at the circuit output matches a paralleled impedance at the first and second outputs over a predetermined range of frequencies.

22. The amplifier circuit of claim 1, wherein the input circuitry includes a balun, the balun including a magnetic core, the magnetic core being saturable so that the circuit input is insensitive to static discharge.

23. The amplifier circuit of claim 1, wherein the output circuitry includes a balun, the balun including a magnetic core, the magnetic core being saturable so that the circuit output is insensitive to static discharge.

24. The amplifier circuit of claim 1, wherein the first amplifier includes a parallel arrangement of a resistor and an inductor coupled between the third field effect transistor and the first output.

25. The amplifier circuit of claim 1, wherein:
the first field effect transistor includes a gate and a drain; and
the first amplifier further includes a capacitor and an inductor and first and second resistors, the first resistor being coupled between the gate and the first input, a series arrangement of the second resistor and the capacitor and the inductor being coupled between the drain and the first input.

26. The amplifier circuit of claim 1, further comprising a low pass filter coupled between the first and third field effect transistors.

27. The amplifier circuit of claim 1, further comprising a filter coupled between the first and third field effect transistors, the filter including a capacitor and a series arrangement of a resistor and an inductor, the capacitor being coupled between a ground and a connection point between the resistor and the inductor.

28. The amplifier circuit of claim 1, wherein:
the first and second amplifiers are amplifiers formed in a first monolithic integrated amplifier;
the amplifier circuit further includes a second monolithic integrated amplifier coupled between the first monolithic integrated amplifier and the output circuitry, the second monolithic integrated circuit including a third amplifier and a fourth amplifier, the fourth amplifier being coupled in a push-pull arrangement with the third amplifier;
the third amplifier includes a fifth field effect transistor coupled to the first output;
the fourth amplifier includes a sixth field effect transistor coupled to the second output;
the third amplifier further includes a seventh field effect transistor coupled to the output circuitry; and
the fourth amplifier further includes an eighth field effect transistor coupled to the output circuitry.

29. The amplifier circuit of claim 28, wherein:
each of the first and second monolithic integrated amplifiers are selected from a family of monolithic integrated amplifiers, each member of the family of monolithic integrated amplifiers having been designed to optimally operate at a unique optimal bias; and
an optimal bias of the first monolithic integrated amplifier being different than an optimal bias of the second monolithic integrated amplifier.

30. The amplifier circuit of claim 1, wherein the first and second amplifiers are amplifiers formed in a monolithic integrated amplifier, the monolithic integrated amplifier being removably attachable to the amplifier circuit by means of a connection, the connection including one of plug-in sockets and solder connections.

31. The amplifier circuit of claim 1 operable over a predetermined range of frequencies, the predetermined range of frequencies including one of frequencies from 40 MHz to 750 MHz and frequencies from 1 MHz to 40 MHz.

32. In a cable access television line amplifier, an amplifier circuit having a circuit input and a circuit output, the amplifier circuit comprising:
a first amplifier having a first input and a first output;
a second amplifier having a second input and a second output, the second amplifier being coupled in a push-pull arrangement with the first amplifier;
input circuitry for coupling the circuit input to the first and second inputs; and
output circuitry for coupling the first and second outputs to the circuit output,
wherein the first amplifier includes a first field effect transistor coupled to the first input, said first field effect transistor having a gate and a drain, a capacitor, an inductor and first and second resisters, the first resistor coupled between the gate and the first input, a series arrangement of the second resistor and the capacitor and the inductor coupled between the drain and the first input, and further including a fifth field effect transistor coupled between the drain of the first field effect transistor and the first output, wherein the second amplifier includes a second field effect transistor coupled to the second input, wherein the first amplifier further includes a third field effect transistor coupled to the first output, wherein the second amplifier further includes a fourth field effect transistor coupled to the second output.

\* \* \* \* \*